(12) United States Patent
Tao et al.

(10) Patent No.: US 9,783,898 B2
(45) Date of Patent: Oct. 10, 2017

(54) SYSTEM AND METHOD FOR PURIFICATION OF ELECTROLYTIC SALT

(71) Applicants: Meng Tao, Fountain Hills, AZ (US); Xiaofei Han, Tempe, AZ (US)

(72) Inventors: Meng Tao, Fountain Hills, AZ (US); Xiaofei Han, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 14/933,274

(22) Filed: Nov. 5, 2015

(65) Prior Publication Data

US 2016/0060772 A1  Mar. 3, 2016

Related U.S. Application Data

(63) Continuation of application No. PCT/US2014/042056, filed on Jun. 12, 2014.
(Continued)

(51) Int. Cl.
*C25B 1/14* (2006.01)
*C25B 15/02* (2006.01)
(Continued)

(52) U.S. Cl.
CPC .............. *C25B 1/14* (2013.01); *C01B 33/037* (2013.01); *C25B 1/006* (2013.01); *C25B 1/26* (2013.01);
(Continued)

(58) Field of Classification Search
CPC ............ C30B 30/02; C25B 1/14; C25B 1/006; C25B 1/26; C25B 9/00; C25B 11/0421;
(Continued)

(56) References Cited

U.S. PATENT DOCUMENTS 3,990,953 A  11/1976  Austin
4,142,947 A   3/1979  Cohen
(Continued)

FOREIGN PATENT DOCUMENTS

WO  2013016215  1/2013

OTHER PUBLICATIONS

International Search Report and the Written Opinion of the International Searching Authority, PCT/US2013/047775 dated Sep. 5, 2013.
(Continued)

*Primary Examiner* — Ciel Thomas
(74) *Attorney, Agent, or Firm* — Snell & Wilmer L.L.P.

(57) ABSTRACT

Methods and systems for removing impurities from an electrolytic salt are disclosed. After removal of impurities from the salt, the salt can be subjected to electrorefining to produce high-purity materials, for example silicon. Impurities are removed from the salt using a system that includes a first working electrode, a counter electrode, and at least one reference electrode. A second working electrode can also be utilized. The salt may be utilized in an electrorefining system, for example a system operated in a single phase or multiple phase operation to produce high-purity materials, such as solar-grade silicon.

9 Claims, 13 Drawing Sheets

Related U.S. Application Data

(60) Provisional application No. 61/835,380, filed on Jun. 14, 2013.

(51) Int. Cl.

| | |
|---|---|
| *C25B 15/08* | (2006.01) |
| *C01B 33/037* | (2006.01) |
| *C30B 30/02* | (2006.01) |
| *C25B 1/00* | (2006.01) |
| *C25B 1/26* | (2006.01) |
| *C25B 9/00* | (2006.01) |
| *C25B 11/04* | (2006.01) |
| *C25F 1/00* | (2006.01) |

(52) U.S. Cl.
CPC ............ *C25B 9/00* (2013.01); *C25B 11/0421* (2013.01); *C25B 15/02* (2013.01); *C25B 15/08* (2013.01); *C25F 1/00* (2013.01); *C30B 30/02* (2013.01)

(58) Field of Classification Search
CPC ....... C25B 15/02; C25B 15/08; C01B 33/037; C25F 1/00
See application file for complete search history.

(56) References Cited

U.S. PATENT DOCUMENTS

| | | | |
|---|---|---|---|
| 4,298,587 A | 11/1981 | Kapur | |
| 4,448,651 A | 5/1984 | Olson | |
| 4,588,485 A | 5/1986 | Cohen | |
| 4,662,998 A | 5/1987 | Stern | |
| 4,923,579 A | 5/1990 | Snyder | |
| 5,378,325 A * | 1/1995 | Dastolfo, Jr. | ............. C25C 3/04 |
| | | | 205/369 |
| 5,976,345 A * | 11/1999 | Pal | ............. C25C 3/00 |
| | | | 204/243.1 |
| 6,896,788 B2 | 5/2005 | Shindo | |
| 7,101,470 B2 | 9/2006 | Stubergh | |
| 7,169,285 B1 * | 1/2007 | O'Grady | ................... C25C 3/28 |
| | | | 205/367 |
| 9,039,885 B1 | 5/2015 | Holland | |
| 2007/0215483 A1 | 9/2007 | Johansen et al. | |
| 2009/0127125 A1 | 5/2009 | Dobberstein | |
| 2010/0276297 A1 | 11/2010 | Powell, IV et al. | |

OTHER PUBLICATIONS

International Preliminary Report on Patentability, PCT/US2013/047775 dated Jan. 8, 2015.

International Search Report and the Written Opinion of the International Searching Authority, PCT/US2014/042056 dated Dec. 10, 2014.

International Preliminary Report on Patentability, PCT/US2014/042056 dated Dec. 23, 2015.

Sharma et al., "A Study on Purification of Metallurgical Grade Silicon by Molten Salt Electrorefining", Metall. Trans. B, vol. 17B, pp. 395-397; Jun. 1986.

Haarberg, et al., "Electrochemical Refining of Silicon in Molten Salts" presentation, Department of Materials Technology, Norwegian University of Science and Technology, Feb. 14, 2010.

Jing, et al., "Purification of Metallurgical Grade Silicon by Electrorefining in Molten Salts", ScienceDirect, Elsevier Science Press, Transactions of Nonferrous Metals Society of China, vol. 22, issue 12, pp. 3103-3107, Dec. 2012.

Non-Final Rejection dated Mar. 23, 2017 in U.S. Appl. No. 14/551,747.

Non-Final Rejection dated May 30, 2017 in U.S. Appl. No. 14/551,747.

* cited by examiner

SYSTEM AND METHOD FOR PURIFICATION OF ELECTROLYTIC SALT

CROSS-REFERENCE TO RELATED APPLICATIONS

This application is a continuation of PCT Application No. PCT/US2014/042056 filed on Jun. 12, 2014 and entitled "SYSTEM AND METHOD FOR PURIFICATION OF ELECTROLYTIC SALT". PCT Application No. PCT/US2014/042056 claims priority to, and the benefit of, U.S. Provisional Application Ser. No. 61/835,380 filed on Jun. 14, 2013 and entitled "SYSTEM AND METHOD FOR PURIFICATION OF ELECTROLYTIC SALT". Each of the above applications is hereby incorporated by reference in their entirety.

TECHNICAL FIELD

The present disclosure generally relates to systems and methods for purifying salts which are used as electrolytes in electrorefining. More particularly, the present disclosure relates to systems and methods of in-situ purification of salt through melting and electrorefining.

BACKGROUND

Conventional refining of high-purity silicon is highly energy-intensive. For example, producing silicon of sufficiently high-purity for use in solar cells, semiconductor devices, and computer chips requires a very high amount of electrical energy. Such high energy demand creates significant costs, and in many instances, makes it prohibitively expensive to refine sufficiently high-purity silicon.

For example, the Siemens method of producing high-purity silicon comprises reducing trichlorosilane to polycrystalline silicon, which occurs by decomposing trichlorosilane on high-purity silicon rods or plates. This process is accomplished at greater than 1000° C., and utilizes water cooling to reduce the temperature of the reactor wall. As such, it requires a very high amount of electrical energy, and consequently, significantly high energy costs.

Because of the high energy usage and cost associated with producing sufficiently high-quality silicon, there exists a need for systems and methods which use less electrical energy. Accordingly, systems and methods to refine silicon in a more energy efficient way, for example by improving the purity of salts that are utilized in producing high-quality silicon and thereby reducing the amount of electrical energy required to refine silicon, are desired.

SUMMARY

Principles of the present disclosure contemplate improved systems and methods for the refining of high-purity silicon, such as solar-grade silicon. In an exemplary embodiment, a system for purifying silicon comprises: a first working electrode and second working electrode; a counter electrode; a reference electrode; and a system control configured to control an electrical potential between at least one of the first working electrode, the second working electrode, and the reference electrode.

In another exemplary embodiment, a method for purification of a salt having one or more impurities comprises: providing a system comprising a first working electrode, a counter electrode, a reference electrode, and a system control, wherein the first working electrode, the counter electrode, and the reference electrode are electrically coupled to the salt; setting a desired electrical potential between the reference electrode and the first working electrode; applying sufficient electrical energy to the system to remove a first targeted impurity from the salt; removing the first working electrode from the salt; electrically coupling a second working electrode to the salt; setting a desired electrical potential between the reference electrode and the second working electrode; and applying sufficient electrical energy to the system to remove a second targeted impurity from the salt.

The contents of this summary section are provided only as a simplified introduction to the disclosure, and are not intended to be used to limit the scope of the appended claims.

BRIEF DESCRIPTION OF THE DRAWING FIGURES

The drawing figures described herein are for illustration purposes only and are not intended to limit the scope of the present disclosure in any way. The present disclosure will become more fully understood from the detailed description and the accompanying drawing figures herein, wherein.

It will be appreciated that elements in the figures are illustrated for simplicity and clarity and have not necessarily been drawn to scale. For example, the dimensions of some of the elements in the figures may be exaggerated relative to other elements to help to improve understanding of illustrated embodiments of the present disclosure.

DETAILED DESCRIPTION

The detailed description of various embodiments herein makes reference to the accompanying drawing figures, which show various embodiments and implementations thereof by way of illustration and best mode, and not of limitation. While these embodiments are described in sufficient detail to enable those skilled in the art to practice the embodiments, it should be understood that other embodiments may be realized and that mechanical, electrical, and other changes may be made without departing from the spirit and scope of the present disclosure.

Also, any reference to "attached", "fixed", "connected", "coupled" or the like may include permanent, removable, temporary, partial, full and/or any other possible attachment option. Additionally, though the various embodiments discussed herein may be carried out in the context of electrorefining, for example electrorefining of silicon, it should be understood that systems and methods disclosed herein may be incorporated into other systems to refine high-purity materials, for example silicon, in accordance with principles of the present disclosure.

For the sake of brevity, conventional techniques for electrorefining, electrolyte processing, and/or the like may not be described in detail herein. Furthermore, the connecting lines shown in various figures contained herein are intended to represent exemplary functional relationships and/or physical couplings between various elements. It should be noted that many alternative or additional functional relationships or physical connections may be present in a practical salt purification system and/or process, electrorefining system and/or process, or the like.

Various exemplary embodiments of an electrorefining system, including a first and second working electrode, a counter electrode, a reference electrode, and a salt having at least one impurity comprise exemplary features hereinafter described. The following description and the annexed drawing figures set forth in detail and demonstrate certain illustrative embodiments of the disclosure. However, these embodiments are indicative of but a few of the various ways in which the principles disclosed herein may be employed. Other objects, advantages and novel features will become apparent from the following detailed description when considered in conjunction with the figures.

Figure 1A:
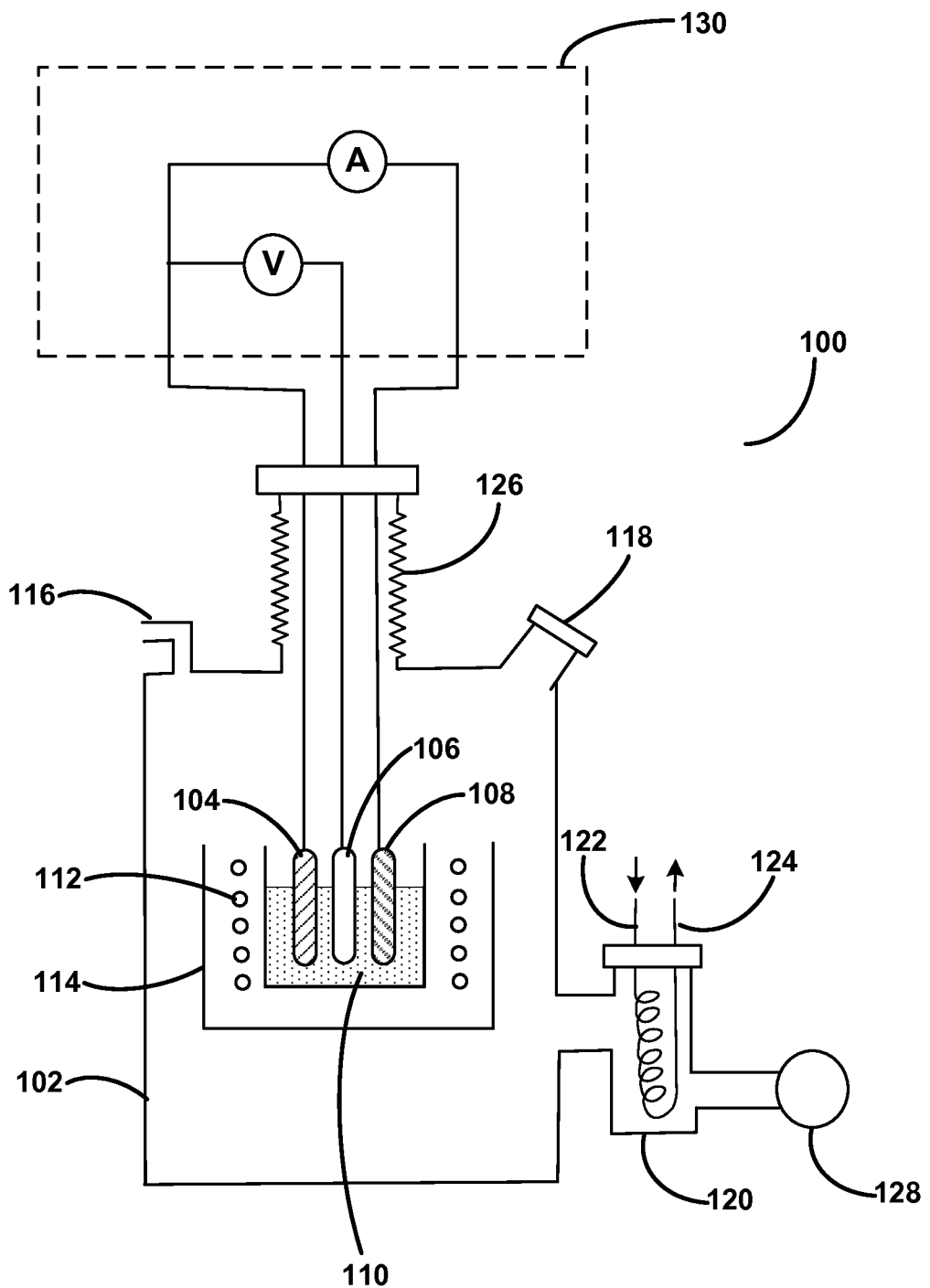
FIGS. 1A and 1B illustrate an exemplary salt purification system in accordance with an exemplary embodiment.
Figure 1B:
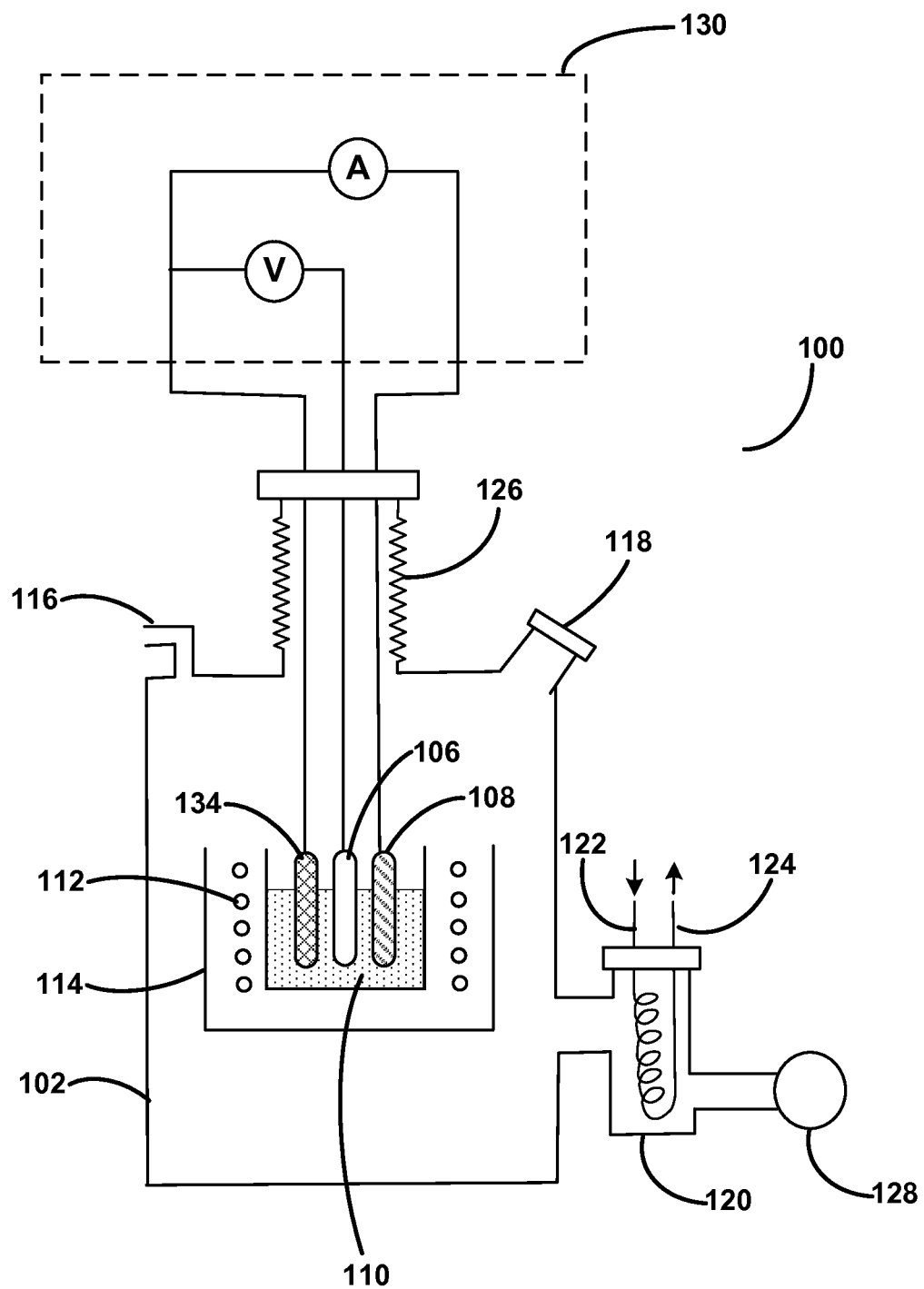

Exemplary systems and methods in accordance with the present disclosure provide the ability to purify, in-situ, a salt having at least one impurity in preparation for refining of certain high-purity materials, for example solar-grade silicon. To assist in understanding the context of the present disclosure, an exemplary salt purification system in accordance with the present disclosure is illustrated in FIGS. 1A and 1B. It will be appreciated that, while various principles of the present disclosure are discussed herein with respect to electrorefining of silicon, principles of the present disclosure may suitably be applied to purification of salt for use in electrorefining of various other materials, for example copper, aluminum, and/or the like.

In various exemplary embodiments, purification system 100 comprises a vessel 102. Vessel 102 can be configured to contain a number of electrodes. Each of the electrodes is operated in contact with an electrolyte 110. Vessel 102 can comprise, for example, a metallic and/or non-metallic material configured to facilitate an electrorefining operation. In various embodiments, vessel 102 comprises stainless steel.

Purification system 100 further comprises electrolyte 110. Electrolyte 110 can comprise, for example, an electrically-conductive molten salt. In various embodiments, electrolyte 110 comprises a cation with a more negative standard reduction potential than silicon, for example potassium, magnesium, calcium, sodium, barium, lithium, and/or the like. However, any cation suitable for use as a component of an electrolyte in the electrorefining of certain metals, for example silicon, is within the scope of the present disclosure.

In various exemplary embodiments, electrolyte 110 can further comprise an anion with an acceptably low cost and capable of forming a stable ionic bond with a cation. For example, chlorine, fluorine, and oxygen are widely used in industrial electrorefining processes and can be provided at a relatively low cost. In certain exemplary embodiments, chlorine and fluorine are preferable to oxygen as oxygen may form silicon dioxide on the surface of electrodes, which may lead to reduced performance of the electrode. However, any anion that is suitable for use as a component of an electrolyte in the electrorefining of certain metals, for example silicon, is within the scope of the present disclosure.

Because higher operating temperatures of an electrorefining system require higher electrical energy, and electrorefining systems operate more effectively at lower operating temperatures, electrolyte 110 can comprise, in various embodiments, a molten salt with a suitably low melting point. For example, a number of suitable molten salt electrolytes 110 comprise salts which melt at temperatures less than 900° C., such as $CaCl_2$ (melting point 817° C.) and LiF (melting point 848° C.). In various embodiments, electrolyte 110 comprises LiCl, which has a melting point of approximately 610° C., a cation (Li) with a more negative standard reduction potential than silicon, and a relatively low cost, non-oxygen anion (Cl). However, any molten salt with a suitably low melting point that facilitates electrorefining of certain metals, for example silicon, is within the scope of the present disclosure.

In various exemplary embodiments, electrolyte 110 may comprise a salt having at least one impurity. An impurity can comprise, for example, a positively-charged ion with a less negative standard reduction potential than the cation of electrolyte 110. In various embodiments, an impurity can also comprise a negatively-charged ion having a more negative standard reduction potential than the anion of electrolyte 110.

In various exemplary embodiments, electrolyte 110 comprises a salt that has been previously processed, for example by an electrorefining process. For example, electrolyte 110 can comprise a salt recycled into purification system 100 from a previous electrorefining process. In various embodiments, electrolyte 110 can comprise a salt that has been subjected to an exemplary electrorefining process as described herein.

In various exemplary embodiments, purification system 100 comprises a heating element 112. In various embodiments, heating element 112 is located within vessel 102. However, heating element 112 may be disposed in any suitable location to facilitate heating and/or melting of electrolyte 110. Moreover, vessel 102 may comprise a thermal shield 114, wherein at least a portion of electrolyte 110 is located within thermal shield 114. In such exemplary embodiments, heating element 112 may be located within a portion of thermal shield 114 and be capable of providing sufficient heat to melt electrolyte 110. Thermal shield 114 also prevents excessive heating of the walls of vessel 102.

In various exemplary embodiments, purification system 100 comprises a pump 128. Pump 128 is capable of reducing and/or controlling the pressure within vessel 102 and/or purification system 100. Pump 128 may also be configured to remove certain materials from vessel 102. For example, in certain exemplary embodiments pump 128 is capable of removing oxygen from vessel 102.

In various exemplary embodiments, purification system 100 further comprises a vent 116. In such exemplary embodiments, it may be desirable to maintain the pressure within vessel 102 at or near a desired point, for example 1 atmosphere. Vent 116 can, for example, allow the pressure of vessel 102 to be stabilized at or near 1 atmosphere, for example by providing inert gas, such as argon or nitrogen, to vessel 102. However, any suitable level of pressure may be utilized, as desirable.

In various exemplary embodiments, purification system 100 comprises a condensation trap 120. In various embodiments, as electrolyte 110 is heated, potentially corrosive salt vapor may be drawn in to pump 128. To prevent damage to pump 128, condensation trap 120 can provide a zone of lower temperature, causing at least a portion of the corrosive salt vapor to condense and not enter pump 128. In various exemplary embodiments, condensation trap 120 utilizes a cooling water loop comprising a water inlet 122 and water outlet 124. However, any apparatus capable of condensing volatile salt vapor and preventing damage to pump 128 and/or other components of purification system 100 is within the scope of the present disclosure.

In various exemplary embodiments, purification system 100 further comprises a first working electrode 104. First working electrode 104 can comprise, for example, an inert metal such as silver, molybdenum, tungsten, nickel, and/or the like. In various embodiments, first working electrode 104 can comprise a non-metal, such as silicon or carbon. Moreover, first working electrode 104 can comprise any material or materials capable of operating as a working electrode.

In various exemplary embodiments, purification system 100 comprises a counter electrode 108. In various embodiments, counter electrode 108 comprises an inert metal such as silver, molybdenum, tungsten, nickel, and/or the like. In various embodiments, counter electrode 108 can comprise a non-metal, such as silicon or carbon. Moreover, counter electrode 108 can comprise any material or materials capable of operating as a counter electrode.

In various exemplary embodiments, purification system 100 comprises a reference electrode 106. For example, reference electrode 106 can comprise a relatively inert and/or stable material with a known standard reduction potential. Additionally, reference electrode 106 can be configured to measure (or facilitate measurement of) a potential difference between reference electrode 106 and first working electrode 104 and/or second working electrode 134.

In various exemplary embodiments, purification system 100 comprises a control system 130. Control system 130 can be configured, for example, to adjust the electrical potential provided to purification system 100 by a power source. In various embodiments, control system 130 comprises a potentiostat. In such exemplary embodiments, control system 130 can maintain the potential difference between reference electrode 106 and first working electrode 104. Additionally, control system 130 can adjust the electrical current provided between first working electrode 104 and counter electrode 108, for example to maintain a desired electrical potential.

In various exemplary embodiments, as illustrated in FIG. 1B, purification system 100 comprises a second working electrode 134. Similar to first working electrode 104, second working electrode 134 can comprise an inert metal such as silver, tungsten, molybdenum, nickel, and/or the like, or a non-metal, such as silicon or carbon. Second working electrode 134 may comprise any material capable of operating as a working electrode. During operation of purification system 100, first working electrode 104 can be removed and replaced with second working electrode 134.

In various exemplary embodiments, purification system 100 comprises bellows 126. Bellows 126 is configured to lift and/or lower one or more electrodes into and/or out of vessel 102 and/or electrolyte 110. Moreover, any method of positioning electrodes within vessel 102 and/or electrolyte 110 is within the scope of the present disclosure. Moreover, any suitable method for raising and/or lowering one or more electrodes and/or raising and/or lowering the assembly of heating element 112, thermal shield 114, and electrolyte 110 is within the scope of the present disclosure. It will be appreciated that purification system 100, via operation of bellows 126 (or other components configured with equivalent functionality) is thus able to remove an electrode with an impurity or impurities deposited thereon from electrolyte 110, ensuring that such impurities are not reintroduced into electrolyte 110.

In various exemplary embodiments, purification system 100 comprises an observation port 118. Observation port 118 can comprise a relatively clear material that allows for visual inspection of purification system 100, including but not limited to electrolyte 110. Observation port 118 can also comprise a removable and/or openable cover which facilitates the use of instruments, for example a pyrometer, to monitor temperatures within vessel 102. In various exemplary embodiments, an operator can use observation port 118 to monitor alignment of various components of vessel 102 or otherwise characterize operation of purification system 100.

In an exemplary embodiment, purification system 100 can be utilized to prepare a suitable salt for electrorefining, for example to produce high-quality silicon such as solar-grade silicon (i.e., 99.9999% pure or above). During operation of purification system 100, electrical potential is applied to first working electrode 104 by control system 130. In various embodiments, electrolyte 110 comprises at least one positively-charged impurity and/or at least one negatively-charged impurity. In embodiments where electrolyte 110 comprises only one type of impurity (i.e., positively- or negatively-charged, but not both), a voltage can be applied to first working electrode 104 to at least partially remove the one type of impurity from electrolyte 110. In embodiments where both positively- and negatively-charged impurities are present, one type of impurity can be removed by operation of first working electrode 104 and, as will be discussed below, another type of impurity can be removed by operation of a second working electrode 134.

In various exemplary embodiments, to facilitate removal of a positively-charged impurity, a negative voltage can be applied to first working electrode 104 via operation of control system 130. The negative voltage applied to first working electrode 104 can be at least that of the reduction potential of the most negative reduction potential of any positively charged impurities present in the salt, for example aluminum and/or the like. The negative voltage can cause the positively-charged impurity to deposit on the surface of first working electrode 104. Once a sufficient and/or desired quantity of one or more positively-charged impurities have deposited on the surface of first working electrode 104, first working electrode 104 can be raised out of electrolyte 110. The negative voltage can then be removed from first working electrode 104 by control system 130.

Conversely, in various exemplary embodiments, to facilitate removal of a negatively-charged impurity from electrolyte 110, a positive voltage can be applied to first working electrode 104. The positive voltage applied to first working electrode 104 can be at least that of the reduction potential of a specific negatively-charged impurity, for example oxygen, phosphorous, arsenic, and/or the like. In various exemplary embodiments, the positive voltage applied to first working electrode 104 is between the oxidation potential of the salt anion and the oxidation potential or potentials of the negatively-charged impurities. The positive voltage causes many of the negatively-charged impurities, for example oxygen, to form volatile molecules and escape the salt in gaseous form. Other negatively-charged impurities may form nonvolatile deposits on the surface of first working electrode 104. Once a sufficient and/or desired quantity of one or more negatively-charged impurities have evaporated from electrolyte 110 and/or deposited on the surface of first working electrode 104, first working electrode 104 can be raised out of electrolyte 110. The positive voltage applied to first working electrode 104 can then be discontinued by control system 130.

In various embodiments, electrolyte 110 comprises both positively- and negatively-charged impurities. In such exemplary embodiments, first working electrode 104 can be used to remove either the positively- or negatively-charged impurities from electrolyte 110. Once a sufficient amount of either the positively- or negatively-charged impurities are removed from electrolyte 110, first working electrode 104 is removed from purification system 100 and replaced with second working electrode 134. Moreover, it will be appreciated that, in various exemplary embodiments, when operation of purification system 100 is transitioned from removal of a first type of impurity to removal of a second type of impurity, a new reference electrode 106 and/or counter electrode 108 may also be provided, in order to avoid and/or reduce reintroduction of the first type of impurity into electrolyte 110.

In various exemplary embodiments, after removal of first working electrode 104, second working electrode 134 can be placed in purification system 100. Second working electrode 134 is configured to remove (or reduce) a remaining type of impurities not removed by first working electrode 104. Stated another way, if first working electrode 104 is used to remove, for example, positively-charged impurities, second working electrode 134 can be used to remove negatively-charged impurities (and vice-versa). For example, in configurations in which positively-charged impurities have been removed from electrolyte 110, remaining negatively-charged impurities in electrolyte 110 can be removed by applying a positive voltage to second working electrode 134 which is at least that of the reduction potential of a specific negatively-charged impurity, such as, for example oxygen, phosphorous, arsenic, and/or the like. In various exemplary embodiments, the positive voltage applied to second working electrode 134 is between the oxidation potential of the salt anion and the oxidation potential or potentials of the negatively-charged impurities. The positive voltage causes the negatively-charged impurities to evaporate and/or deposit on the surface of second working electrode 134. Once a sufficient and/or desired quantity of one or more negatively-charged impurities have evaporated and/or deposited on the surface of second working electrode 134, second working electrode 134 can be raised out of electrolyte 110. The positive voltage applied to second working electrode 134 can be then discontinued by control system 130.

After sufficient impurities have been removed from electrolyte 110, electrolyte 110 can be forwarded for use in an electrorefining process, for example for the purification of silicon. In various exemplary embodiments, purification system 100 can be configured to purify silicon through electrorefining by removal of the working electrode (either first working electrode 104 or second working electrode 134) and the counter electrode and introduction of a new working electrode and a new counter electrode, as will be discussed in greater detail herein. In other embodiments, electrolyte 110 can be removed from purification system 100 and provided to a separate electrorefining system. Although described below in connection with a number of exemplary electrorefining systems, any electrolyte system capable of utilizing electrolyte 110 to purify silicon is within the scope of the present disclosure.

Figure 2A:
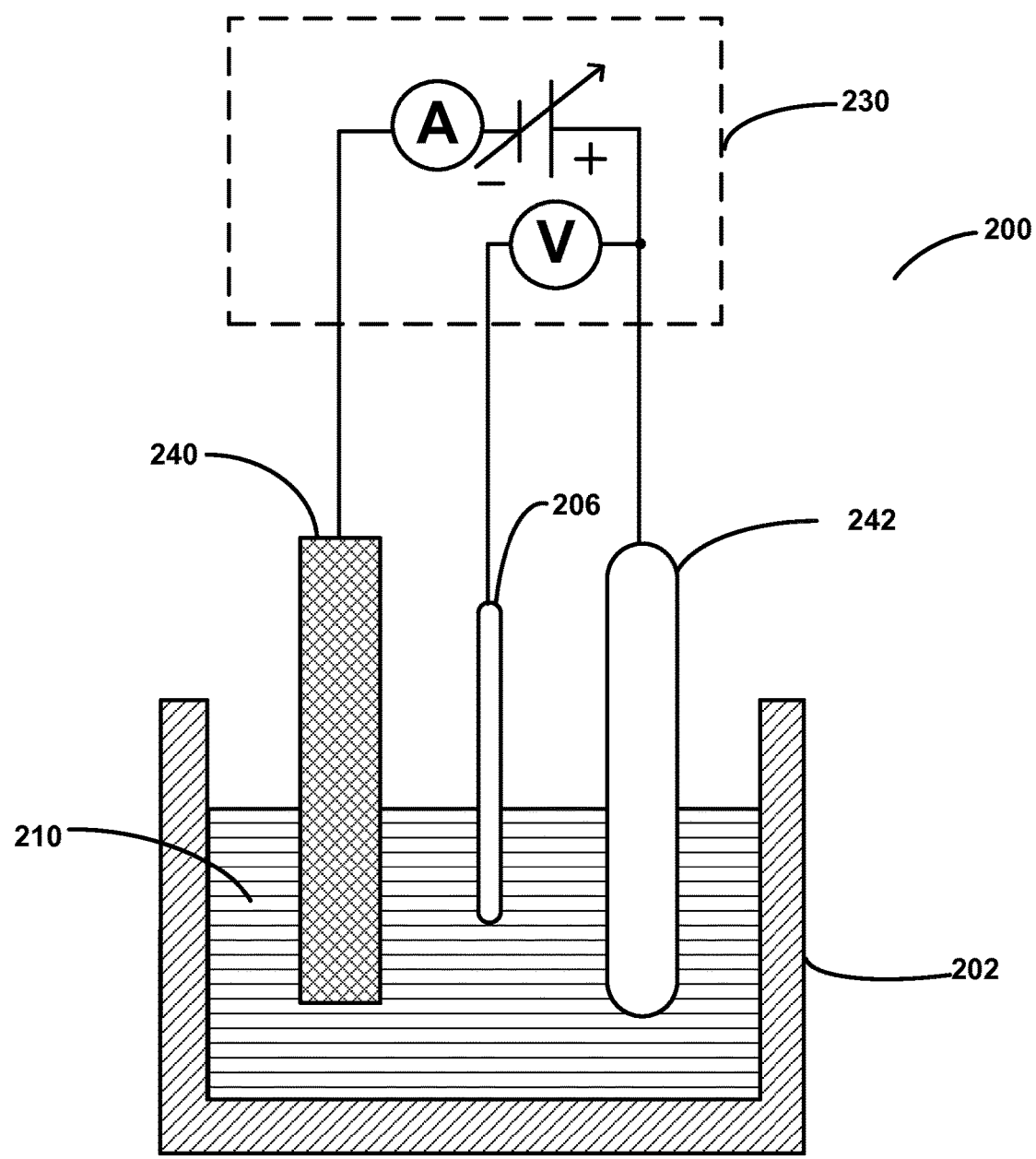
FIGS. 2A and 2B illustrate an exemplary electrorefining system in accordance with an exemplary embodiment.

In various exemplary embodiments, as illustrated in FIG. 2A, an exemplary electrorefining system 200 comprises a cathode 240. Cathode 240 can comprise, for example, a high-purity silicon sheet or rod. In such configurations, silicon is deposited on the surface of cathode 240 as electrical energy is applied to electrorefining system 200. In other embodiments, cathode 240 can comprise a non-silicon metal, such as tungsten. However, at higher operating temperatures (for example, at or greater than 600° C.), silicon can form silicides with metals such as tungsten. Therefore, in electrorefining systems operating at temperatures greater than 600° C., it is preferable for cathode 240 to comprise high-purity silicon.

In various exemplary embodiments, electrorefining system 200 comprises an anode 242. In various embodiments, anode 242 can comprise a silicon-containing compound which dissolves as electrical energy is applied to electrorefining system 200. In such configurations, electrical energy applied to electrorefining system 200 causes silicon from the anode to dissolve into electrolyte 210. The dissolved silicon is then free to travel throughout the electrolyte.

Anode 242 can comprise, for example, a rod or sheet of metallurgical-grade silicon. In other embodiments, anode 242 comprises an alloy, such as silicon and copper. However, any silicon-containing compound which is capable of dissolving when electrical energy is applied is within the scope of the present disclosure.

In various exemplary embodiments, electrorefining system 200 can be utilized in a two phase process for the electrorefining of high-purity silicon, for example solar-grade silicon. During operation of electrorefining system 200, electrical potential is applied to anode 242 via operation of control system 230. As electrical potential is applied, silicon is dissolved from anode 242 into electrolyte 210, along with one or more impurities. Silicon and other species dissolved from anode 242 travel through electrolyte 210 and deposit on cathode 240. Electrorefining system 200 can be configured to maintain a desired rate of dissolution from anode 242, for example by varying one or more of a voltage applied to anode 242 and/or current passing through anode 242.

In various exemplary embodiments, during a first phase of operation of electrorefining system 200, control system 230 can be utilized to maintain a desired potential difference between anode 242 and reference electrode 206. For example, it may be desirable to maintain the potential difference between anode 242 and reference electrode 206 at or below the standard oxidation potential of silicon at the operating temperature of electrorefining system 200. By maintaining a relatively low potential difference between anode 242 and reference electrode 206, a relatively high rate of dissolution of silicon from the anode is achieved; however, the concentration of one or more impurities in electrolyte 210 may be increased. After a sufficient amount of silicon has dissolved from anode 242 and/or a sufficient amount of time has passed, electrorefining system 200 can be operated in a second phase of operation.

Figure 2B:
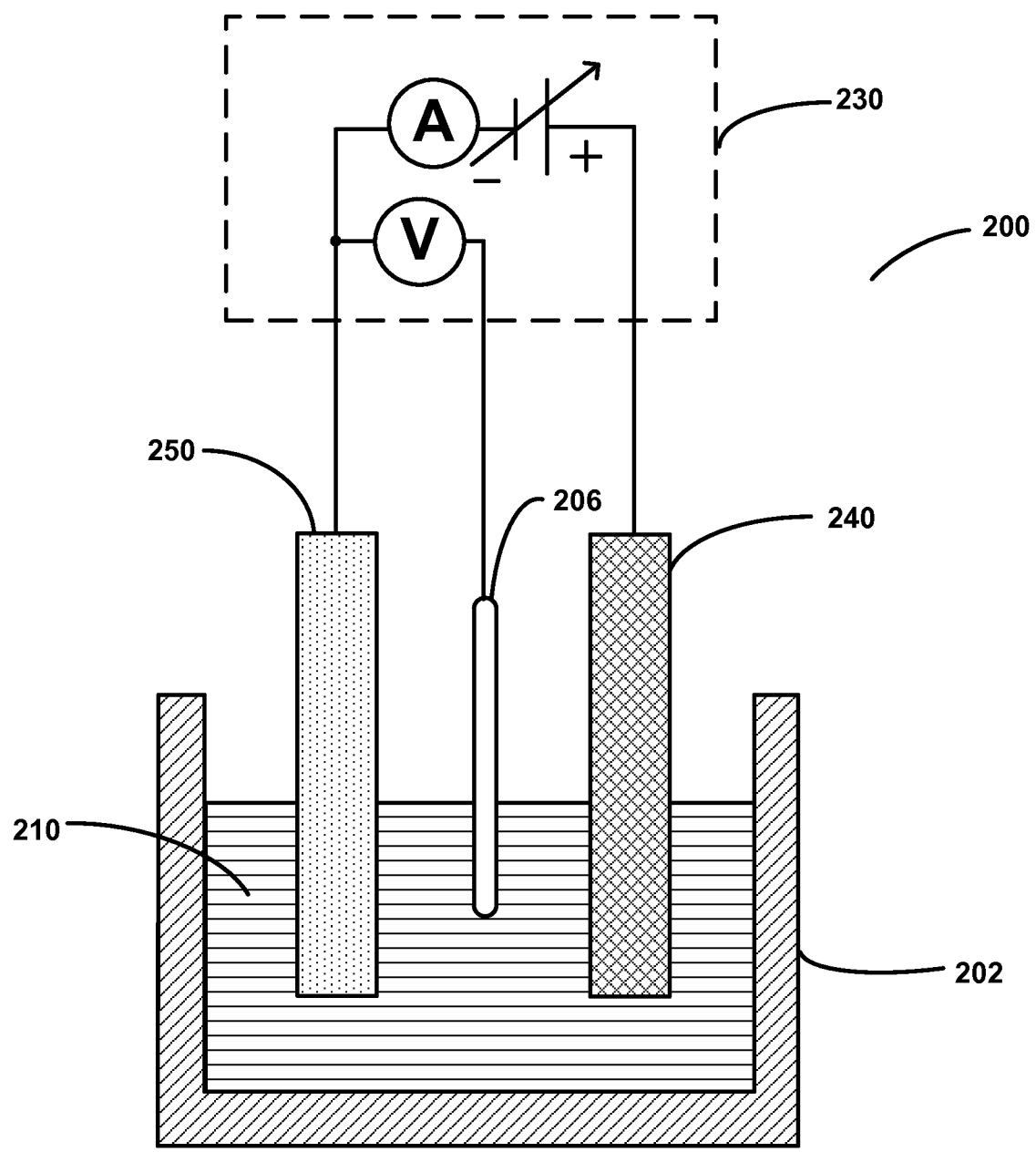

Turning now to FIG. 2B, in various exemplary embodiments, during a second phase of operation of electrorefining system 200, anode 242 is removed and second cathode 250 is inserted into vessel 202. During the second phase of operation, first cathode 240 is operated as an anode, and second cathode 250 is operated as a cathode. As electrical energy is applied to the system, control system 230 is used to maintain a desired potential difference between second cathode 250 and reference electrode 206. For example, it may be desirable to maintain the potential difference between second cathode 250 and reference electrode 206 between a minimum and maximum level. In various exemplary embodiments, the minimum potential difference is the standard reduction potential of silicon at the process temperature. By maintaining a relatively low potential difference, the amount of impurities deposited on second cathode 250 by electrolyte 210 is maintained at a relatively low level.

In various exemplary embodiments, the maximum potential difference between second cathode 250 and reference electrode 206 may be limited by the target concentration of one or more impurities. As the potential difference increases, one or more impurities in electrolyte 210 are deposited more rapidly on second cathode 250, which can increase the concentration of the one or more impurities. Therefore, it may be desirable to maintain a potential difference between second cathode 250 and reference electrode 206 between a minimum and maximum level, as described above. After a sufficient amount of high-purity silicon has deposited on the surface of second cathode 250 and/or a sufficient amount of time has passed, the second phase of operation of electrorefining system 200 can be terminated, and second cathode 250 removed for further processing.

Figure 3A:
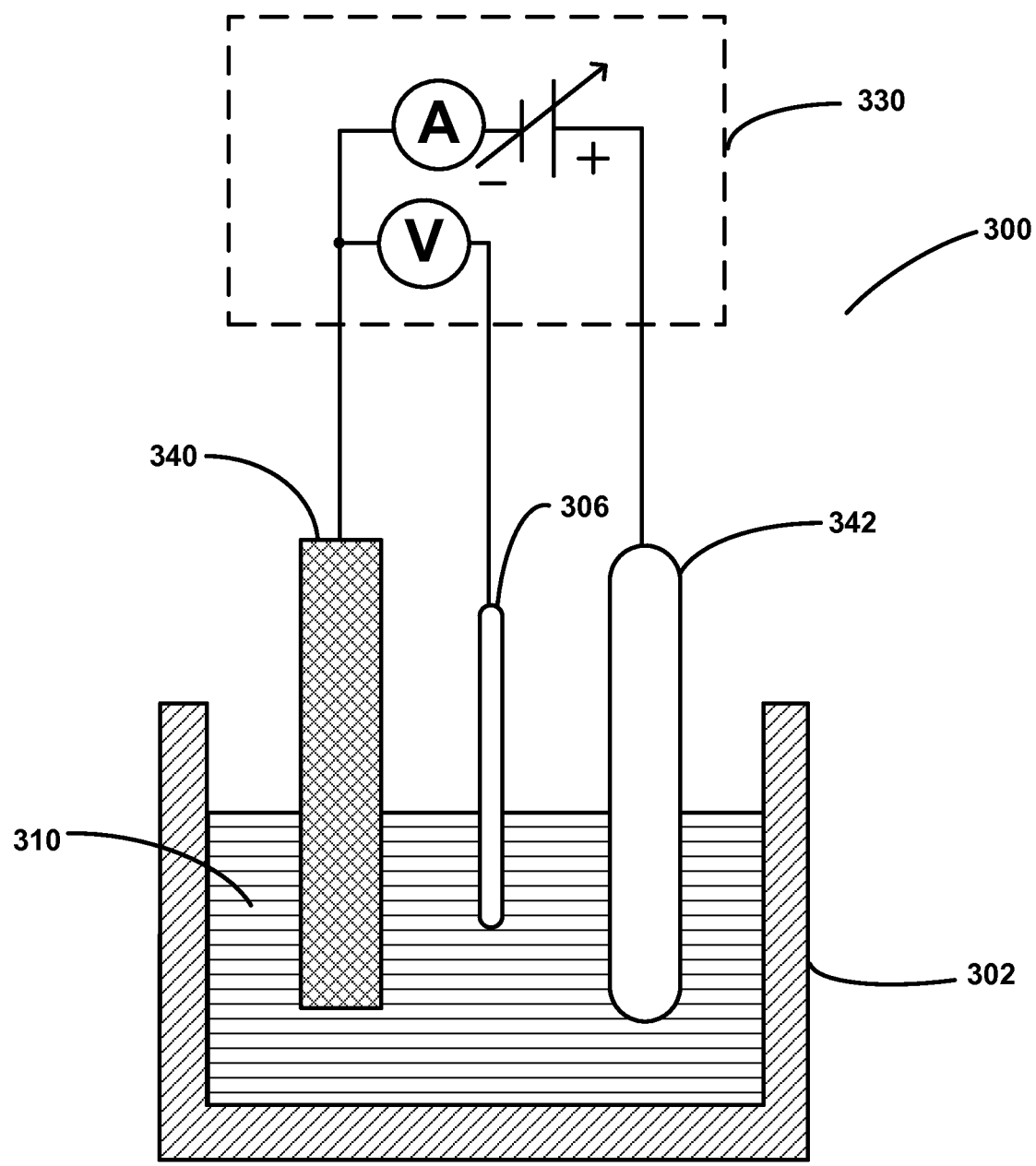
FIGS. 3A and 3B illustrate another exemplary electrorefining system in accordance with an exemplary embodiment.
Figure 3B:
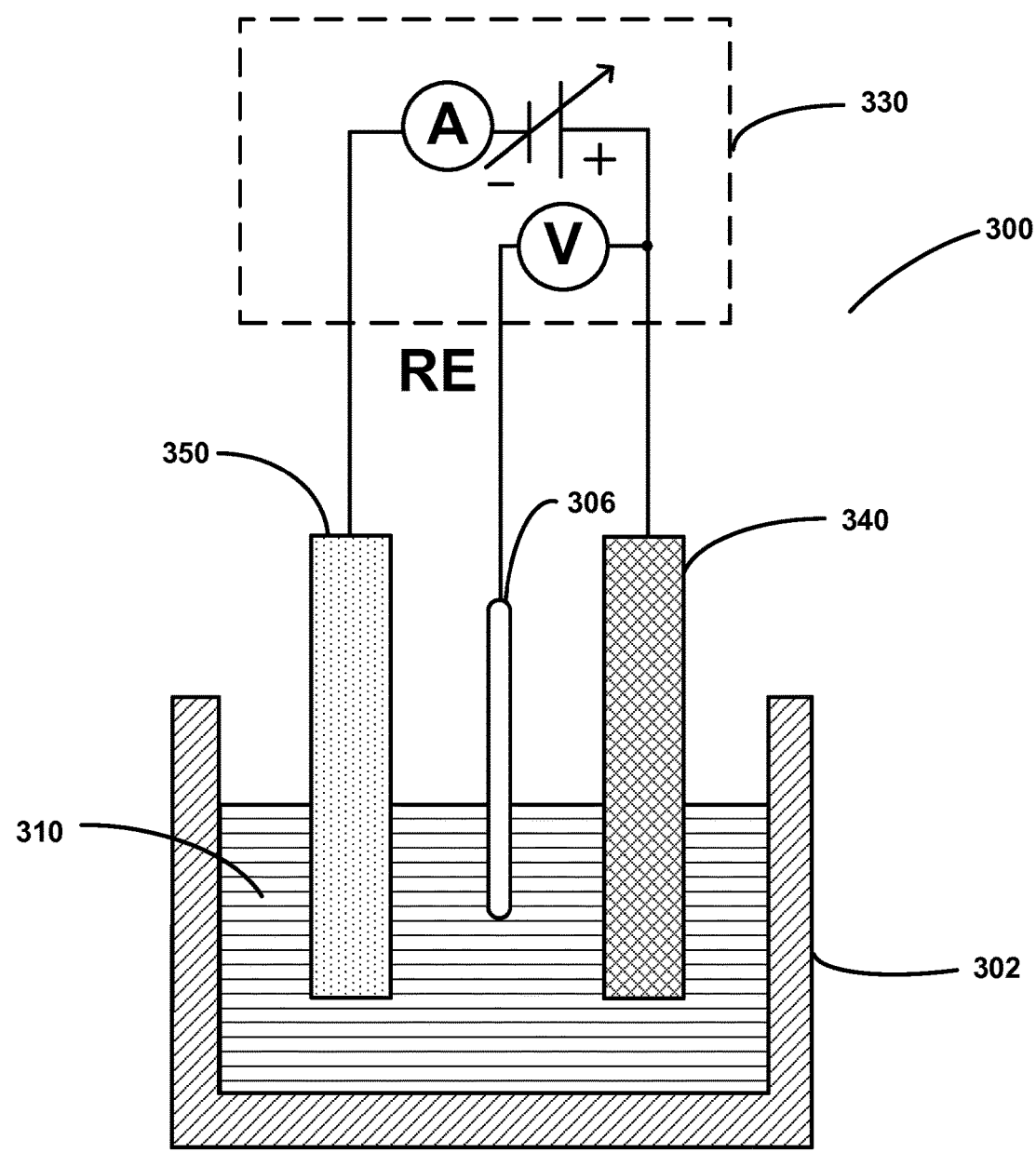

In another exemplary embodiment, and with initial reference to FIGS. 3A and 3B, an electrorefining system 300 can be operated in a two phase process to electrorefine high-purity material, for example solar-grade silicon. FIG. 3A illustrates a first phase of operation of electrorefining system 300. During the first phase of operation, the potential difference between a cathode 340 and a reference electrode 306 is controlled by control system 330. As previously discussed in relation to the second phase of operation of electrorefining system 200, the potential difference between cathode 340 and reference electrode 306 can be maintained at a desired level to achieve a suitably high rate of deposition of silicon and a suitably low concentration of impurities on the surface of cathode 340.

FIG. 3B illustrates a second phase of operation of electrorefining system 300. During the second phase of operation, anode 342 is removed and second cathode 350 is inserted into an electrolyte 310 in vessel 302. During the second phase of operation, first cathode 340 is operated as an anode and second cathode 350 is operated as a cathode. The potential difference between first cathode 340 (operating as an anode) and reference electrode 306 is controlled by control system 330. As previously discussed in relation to the first phase of operation of electrorefining system 200, the potential difference between first cathode 340 (operating as an anode) and reference electrode 306 can be maintained at a desired level to achieve a suitably high rate of dissolution of silicon and a suitably low rate of dissolution of impurities from first cathode 340 (operating as an anode).

Figure 4A:
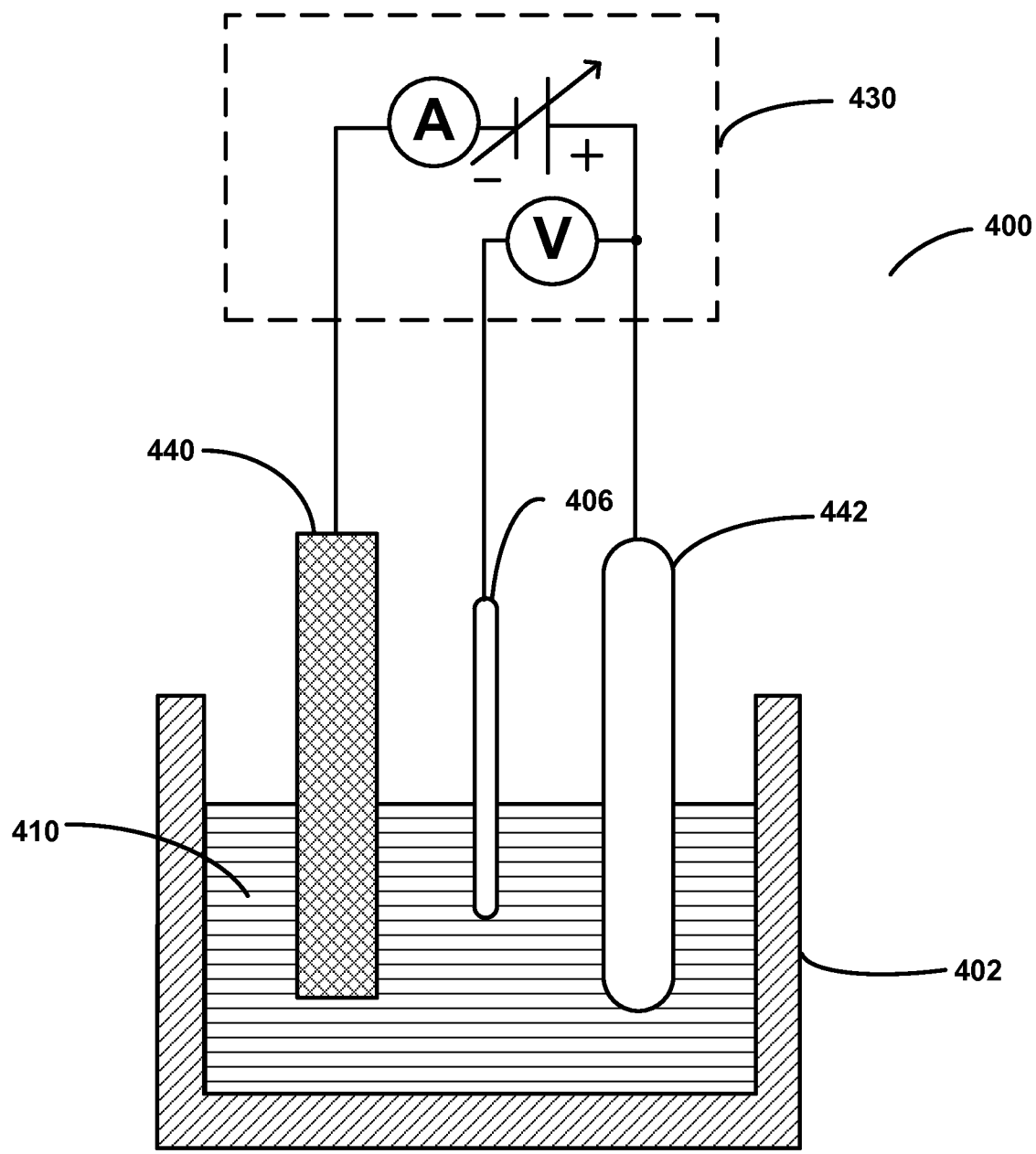
FIGS. 4A-4C illustrate yet another exemplary electrorefining system in accordance with an exemplary embodiment.
Figure 4B:
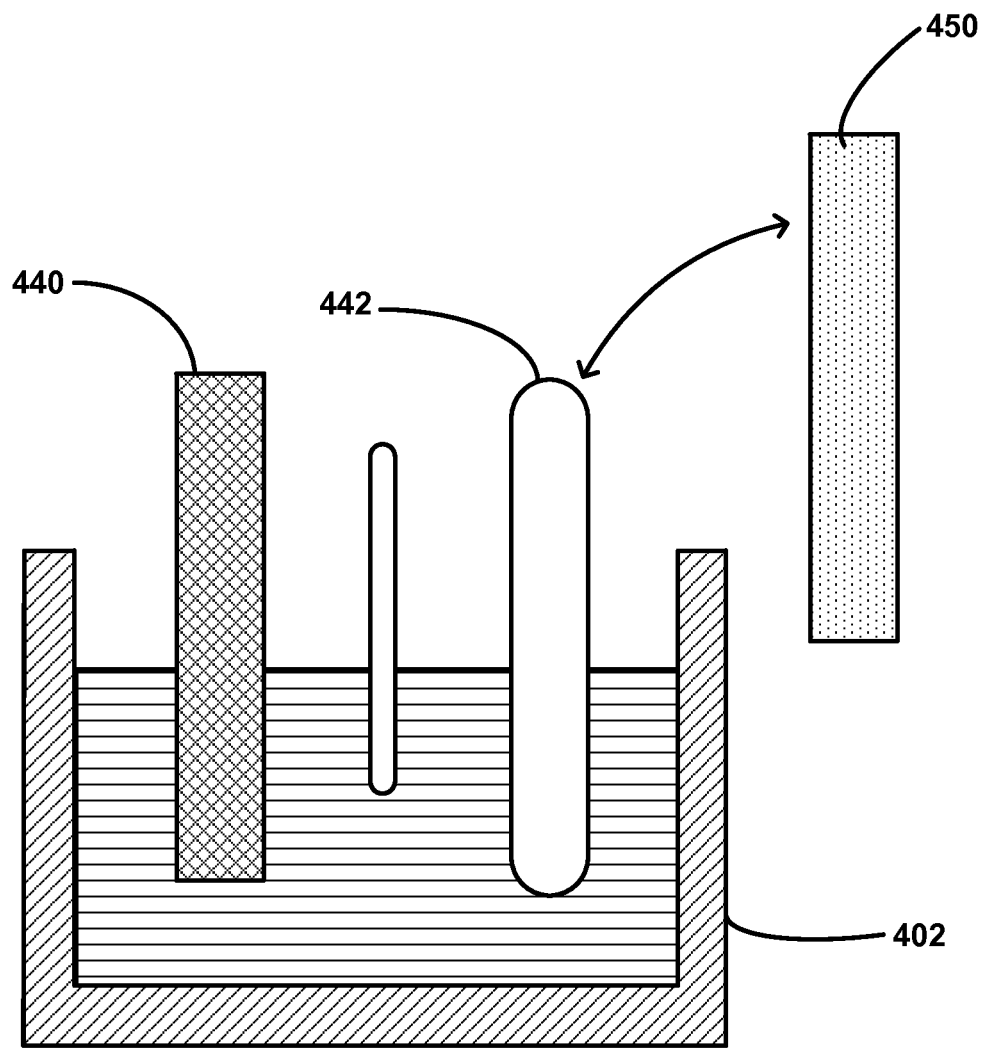
Figure 4C:
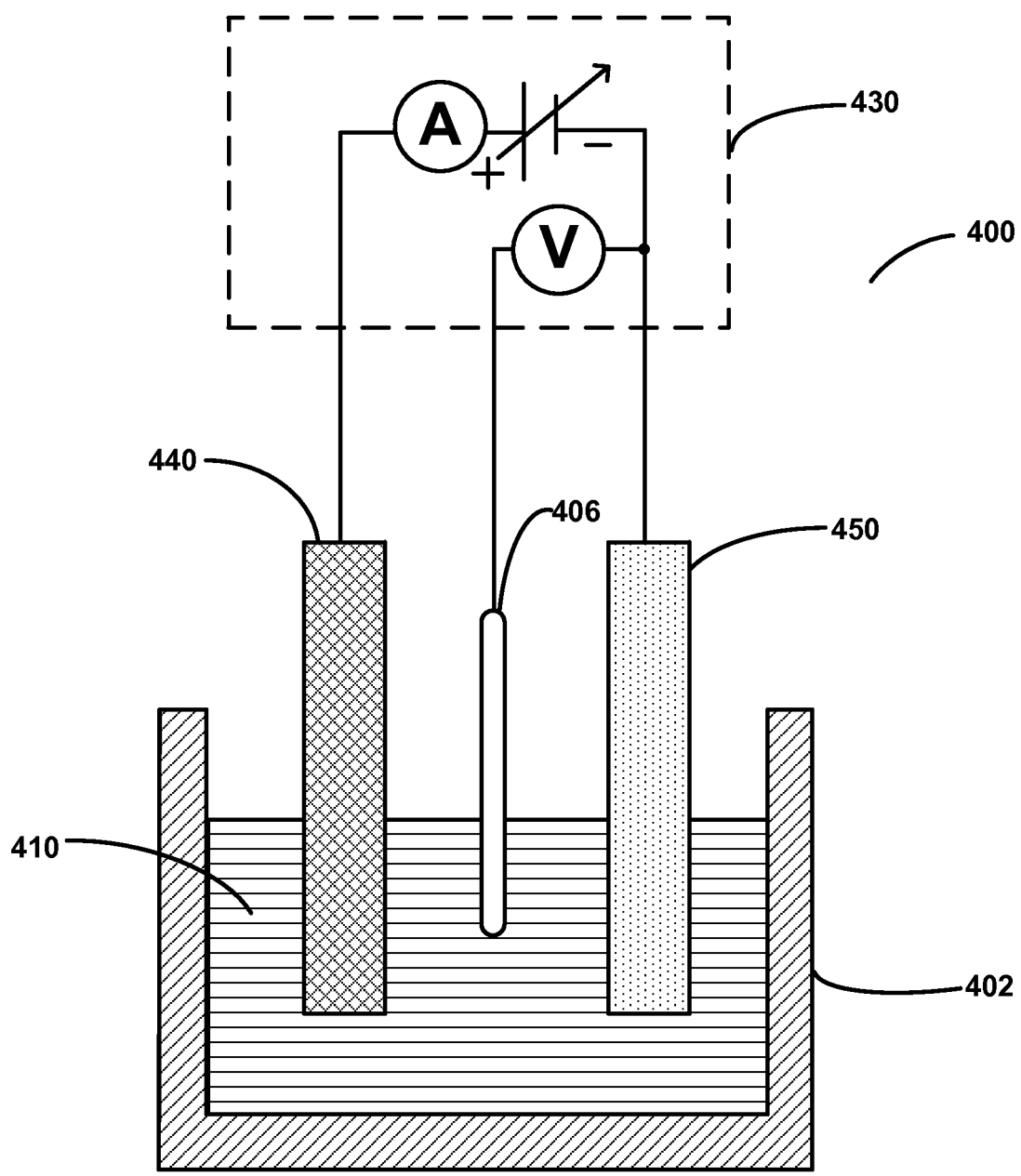

In various exemplary embodiments, and with initial reference to FIGS. 4A-4C, an exemplary electrorefining system 400 can be operated in a two phase process to electrorefine high-purity material, for example solar-grade silicon. As illustrated in FIG. 4A, during the first phase of operation, electrorefining system 400 comprises a first cathode 440 and an anode 442 inserted into an electrolyte 410. During the first phase of operation, the electrical potential between anode 442 and a reference electrode 406 is controlled by a control system 430. As discussed in relation to the first phase of operation of exemplary electrorefining system 200, the potential difference between anode 442 and reference electrode 406 can be maintained at a desired level to achieve a suitably high rate of dissolution of silicon and a suitably low rate of dissolution of impurities from anode 442.

After a sufficient time of operation of electrorefining system 400 in the first phase configuration, as illustrated in FIG. 4B, anode 442 is removed and second cathode 450 is inserted into vessel 402. As illustrated in FIG. 4C, during a second phase of operation, first cathode 440 is operated as an anode, and second cathode 450 is operated as a cathode. During the second phase, the potential difference between second cathode 450 and reference electrode 406 is controlled by control system 430. As previously discussed in relation to the second phase of operation of electrorefining system 200, the potential difference between second cathode 450 and reference electrode 406 can be maintained at a desired level to achieve a suitably high rate of deposition of silicon and a suitably low concentration of impurities on the surface of second cathode 450. Such a two phase operation allows for the use of a single electrorefining system 400 to subject the silicon of anode 442 to two stages of dissolution and deposition, which can improve the quality of silicon ultimately deposited on the surface of second cathode 450 by, for example, minimizing the concentration of one or more impurities.

Figure 5A:
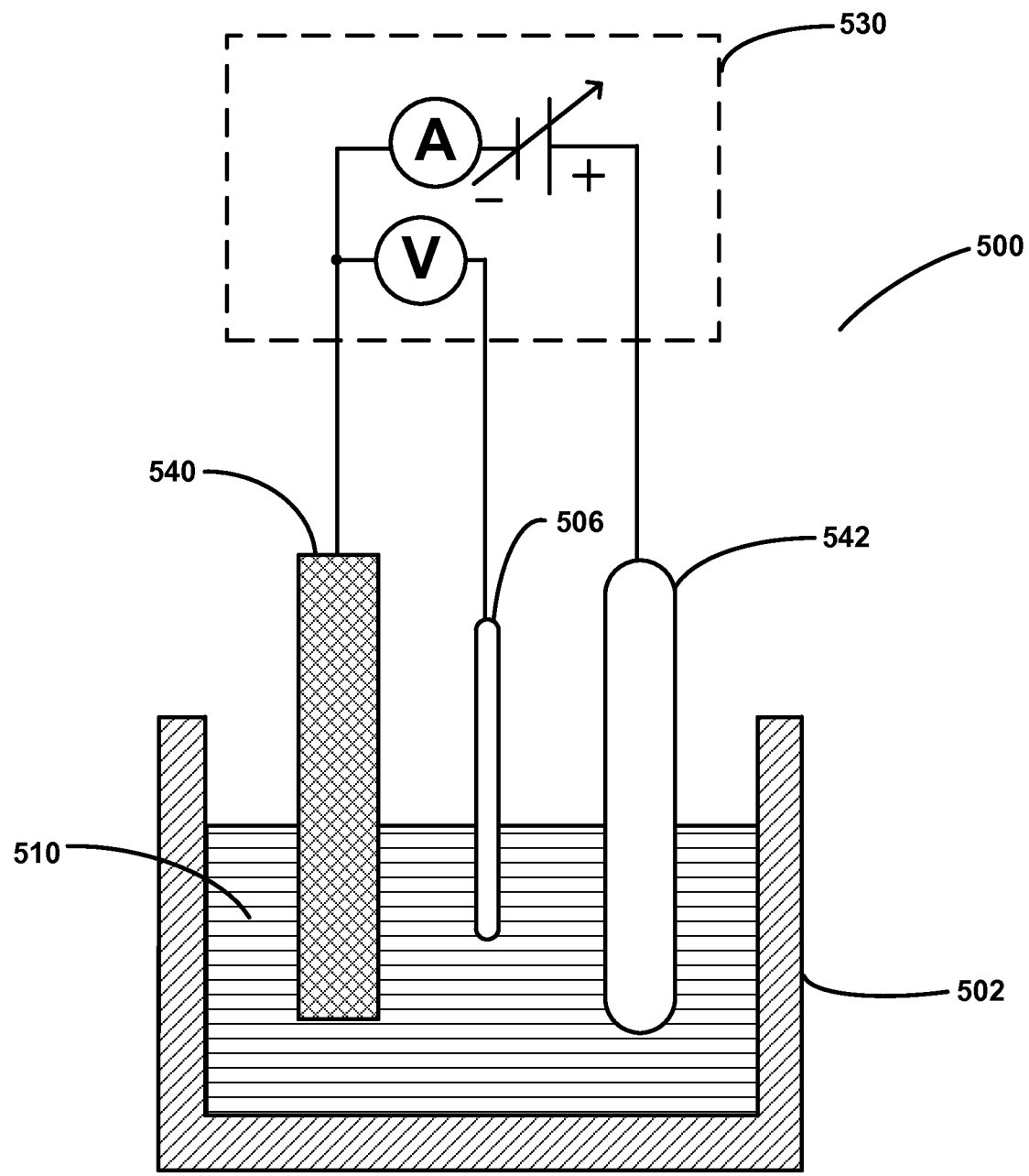
FIGS. 5A-5C illustrate yet another exemplary electrorefining system in accordance with an exemplary embodiment.
Figure 5B:
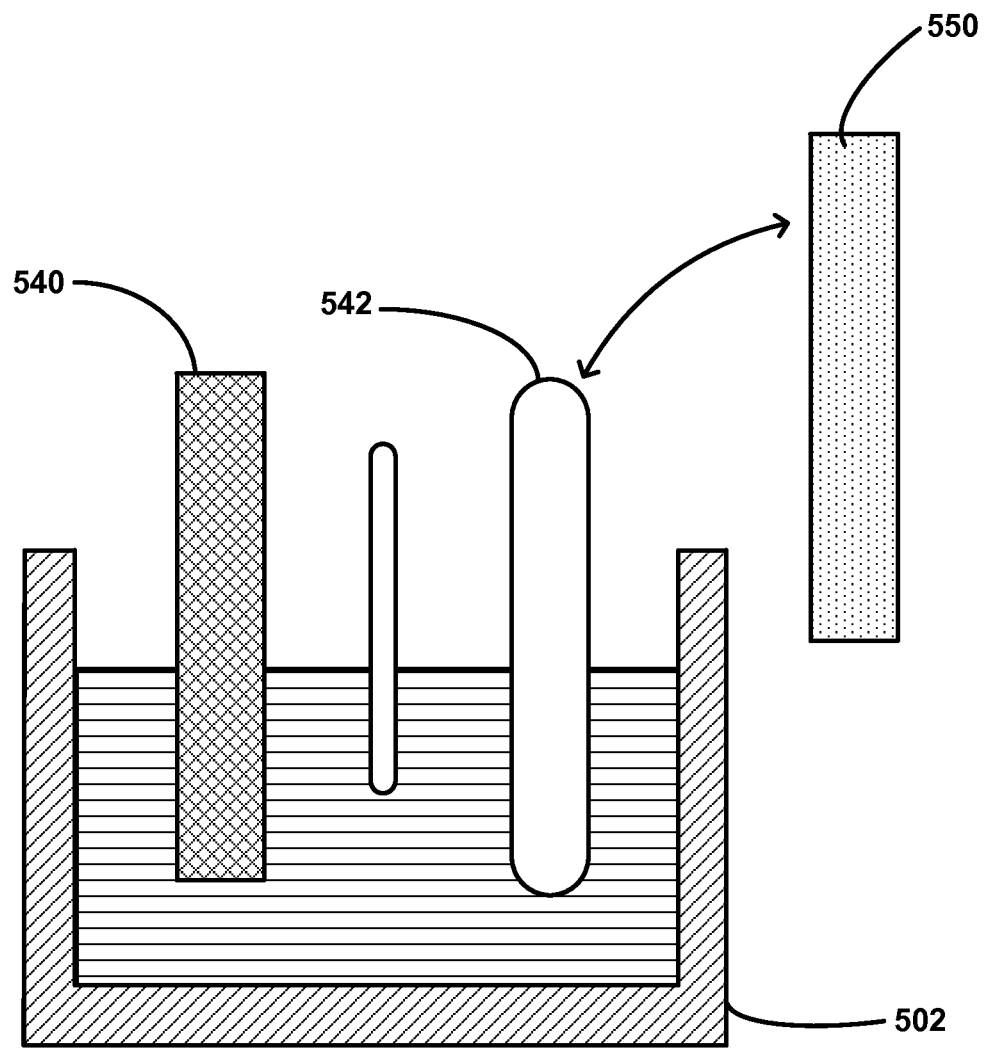
Figure 5C:
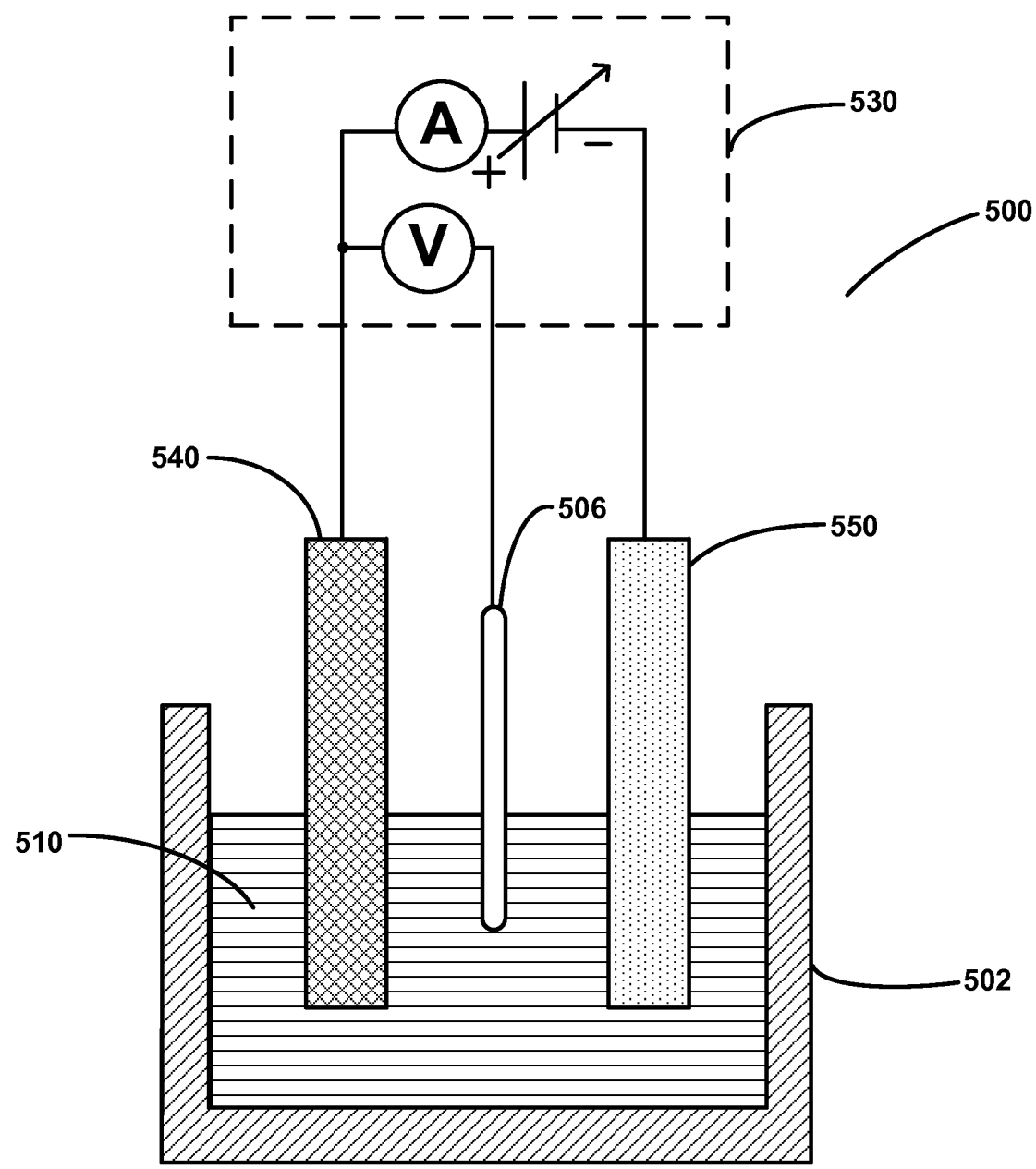

In another exemplary embodiment, and with initial reference to FIGS. 5A-5C, an exemplary electrorefining system 500 can be operated in a two phase process to electrorefine high-purity material, for example solar-grade silicon. As illustrated in FIG. 5A, during a first phase of operation, electrorefining system 500 comprises a first cathode 540 and an anode 542 inserted into an electrolyte 510. During the first phase of operation, the potential difference between first cathode 540 and a reference electrode 506 is controlled by a control system 530. As discussed in relation to the second phase of operation of exemplary electrorefining system 200, the potential difference between first cathode 540 and reference electrode 506 can be maintained at a desired level to achieve a suitably high rate of deposition of silicon and a suitably low rate of deposition of impurities on the surface of first cathode 540.

After a sufficient time of operation of electrorefining system 500 in the first phase configuration, as illustrated in FIG. 5B, anode 542 is removed and second cathode 550 is inserted into vessel 502. As illustrated in FIG. 5C, during the second phase of operation, first cathode 540 is operated as an anode and the potential difference between first cathode 540 (operating as an anode) and reference electrode 506 is controlled by control system 530. As previously discussed in relation to the first phase of operation of electrorefining system 200, the potential difference between first cathode 540 (operating as an anode) and reference electrode 506 can be maintained at a desired level to achieve a suitably high rate of dissolution of silicon and a suitably low dissolution rate of impurities from first cathode 540 (operating as an anode). Such a two phase operation allows for the use of a single electrorefining system 500 to subject the silicon of anode 542 to two stages of dissolution and deposition, which can improve the quality of silicon ultimately deposited on the surface of second cathode 550 by, for example, minimizing the concentration of one or more impurities.

Figure 6A:
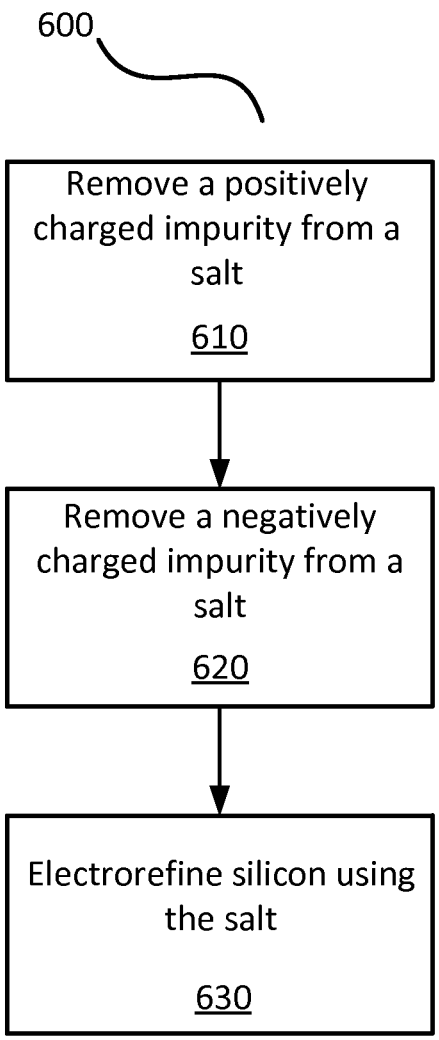
FIG. 6A illustrates a method for purifying a salt and electrorefining silicon in accordance with an exemplary embodiment.

With reference now to FIG. 6A, in various exemplary embodiments a method 600 comprises: in a vessel, removing a positively-charged impurity from a salt via operation of a purification system comprising a working electrode, a counter electrode, and a reference electrode (step 610); in the vessel, removing a negatively-charged impurity from the salt via the purification system (step 620); and in the vessel, electrorefining silicon using the salt as an electrolyte (step 630).

Figure 6B:
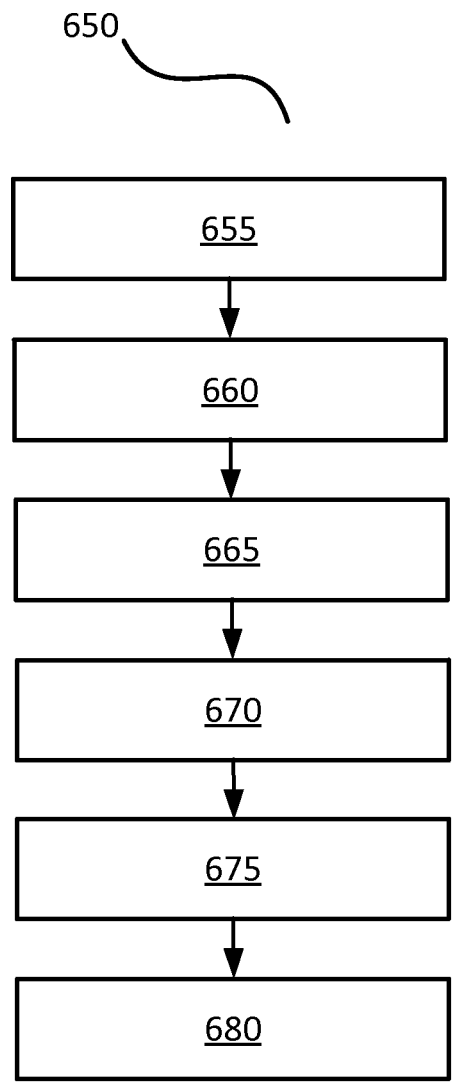
FIG. 6B illustrates a method for purifying a salt in accordance with an exemplary embodiment.

Turning to FIG. 6B, in various exemplary embodiments a method 650 for purifying a salt having multiple impurities comprises setting, via a system control, a desired electrical potential between a reference electrode and a first working electrode (step 655); applying sufficient electrical energy to the system to remove a first targeted impurity from the salt (step 660); removing the first working electrode from the salt (step 665); electrically coupling a second working electrode to the salt (step 670); setting, via the system control, a desired electrical potential between the reference electrode and the second working electrode (step 675); and applying sufficient electrical energy to the system to remove a second targeted impurity from the salt (step 680).

In accordance with principles of the present disclosure, exemplary systems and methods of electrorefining provide means to produce sufficiently high-purity materials, for example silicon. The improved control of operating conditions described herein, such as operating temperatures and various potential differences, beneficially increases the purity of electrorefined materials, for example solar-grade silicon.

The present disclosure has been described above with reference to a number of exemplary embodiments. It should be appreciated that the particular embodiments shown and described herein are illustrative of inventive principles and its best mode and are not intended to limit in any way the scope of the invention. Those skilled in the art having read this disclosure will recognize that changes and modifications may be made to the exemplary embodiments without departing from the scope of the present disclosure. Various aspects and embodiments may be applied to fields of use other than electrorefining silicon. Although certain aspects of the present disclosure are described herein in terms of exemplary embodiments, such aspects may be achieved through any number of suitable means now known or hereafter devised. Accordingly, these and other changes or modifications are intended to be included within the scope of the present disclosure.

While exemplary method steps outlined herein represent exemplary embodiments of principles of the present disclosure, practitioners will appreciate that variations thereon may be applied to create similar results. The steps are presented for the sake of explanation only and are not intended to limit the scope of the present disclosure in any way. Benefits, other advantages, and solutions to problems have been described herein with regard to specific embodiments. However, the benefits, advantages, solutions to problems, and any element(s) that may cause any benefit, advantage, or solution to occur or become more pronounced are not to be construed as critical, required, or essential features or elements of any or all of the claims.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. When language similar to "at least one of A, B, or C" or "at least one of A, B, and C" is used in the claims, the phrase is intended to mean any of the following: (1) at least one of A; (2) at least one of B; (3) at least one of C; (4) at least one of A and at least one of B; (5) at least one of B and at least one of C; (6) at least one of A and at least one of C; or (7) at least one of A, at least one of B, and at least one of C.

What is claimed is:

1. A method for purifying a salt having multiple impurities, the method comprising:
    providing a system comprising a first working electrode, a counter electrode, a reference electrode, and a system control, wherein the first working electrode, the counter electrode, and the reference electrode are electrically coupled to the salt;
    setting, via the system control, a desired electrical potential between the reference electrode and the first working electrode;
    applying sufficient electrical energy to the system to cause a negatively-charged first targeted impurity within the salt to deposit on the surface of the first working electrode;
    removing the first working electrode from the salt;
    electrically coupling a second working electrode to the salt;
    setting, via the system control, a desired electrical potential between the reference electrode and the second working electrode; and
    applying sufficient electrical energy to the system to cause a positively-charged second targeted impurity within the salt to deposit on the surface of the second working electrode.

2. The method of claim 1, wherein the salt comprises LiCl.

3. The method of claim 1, wherein the applying sufficient electrical energy to the system to cause the negatively-charged first targeted impurity within the salt to deposit on the surface of the first working electrode comprises applying a positive voltage to the first working electrode by the system control.

4. The method of claim 1, wherein the applying sufficient electrical energy to the system to cause the positively-charged second targeted impurity within the salt to deposit on the surface of the second working electrode comprises applying a negative voltage to the second working electrode by the system control.

5. A method, comprising:
    in a vessel, removing a positively-charged impurity from a salt via operation of a purification system comprising a working electrode, a counter electrode, and a reference electrode by applying a sufficient electrical energy to the system between the reference electrode and the working electrode to cause the positively-charged impurity to deposit on the working electrode, wherein the salt comprises a non-oxygen anion and a metal cation having a more negative standard reduction potential than silicon;
    replacing the working electrode with a second working electrode;
    in the vessel, removing a negatively-charged impurity from the salt via the purification system by applying a sufficient electrical energy between the reference electrode and the second working electrode to cause the negatively-charged impurity to deposit on the second working electrode; and
    in the vessel, electrorefining silicon using the salt as an electrolyte.

6. The method of claim 5, wherein the salt comprises LiCl.

7. The method of claim 5, wherein the silicon produced by the step of electrorefining comprises solar-grade silicon.

8. The method of claim 5, wherein a system control provides an electrical potential between the reference electrode and the second working electrode operated as an anode.

9. The method of claim 5, wherein a control system provides an electrical potential between the reference electrode and the working electrode operated as a cathode.

* * * * *